# (12) United States Patent
Itou et al.

(10) Patent No.: US 7,632,349 B2
(45) Date of Patent: Dec. 15, 2009

(54) SILICON WAFER SURFACE DEFECT EVALUATION METHOD

(75) Inventors: Wataru Itou, Tokyo (JP); Takeshi Hasegawa, Tokyo (JP); Takaaki Shiota, Tokyo (JP)

(73) Assignee: Sumco Corporation, Tokyo (JP)

( * ) Notice: Subject to any disclaimer, the term of this patent is extended or adjusted under 35 U.S.C. 154(b) by 84 days.

(21) Appl. No.: 11/467,411

(22) Filed: Aug. 25, 2006

(65) Prior Publication Data

US 2007/0044709 A1    Mar. 1, 2007

(30) Foreign Application Priority Data

Aug. 26, 2005  (JP)  ............................. 2005-245105
Jun. 20, 2006  (JP)  ............................. 2006-169888

(51) Int. Cl.
*C30B 33/00* (2006.01)
(52) U.S. Cl. ............................. 117/14; 117/19; 117/20; 324/323; 324/326; 324/332; 324/765
(58) Field of Classification Search ............... 117/14, 117/19, 20; 324/323, 326, 332, 765
See application file for complete search history.

(56) References Cited

U.S. PATENT DOCUMENTS

| | | | |
|---|---|---|---|
| 4,181,538 A | 1/1980 | Narayan et al. | |
| 4,598,249 A | 7/1986 | Goodman | |
| 5,272,119 A | 12/1993 | Falster | |
| 5,369,495 A | 11/1994 | Lagowski | |
| 5,581,194 A | 12/1994 | Lowell | |
| 5,742,175 A * | 4/1998 | Kato et al. ................. | 324/765 |
| 5,742,176 A * | 4/1998 | Kato et al. ................. | 324/765 |

(Continued)

FOREIGN PATENT DOCUMENTS

CN    1256723    6/2000

(Continued)

OTHER PUBLICATIONS

Zoth et al, "A fast, preparation-free method to detection iron in silicon," J. Appl. Phys. 67 (11), Jun. 1990, pp. 6764-6771.*

(Continued)

*Primary Examiner*—Michael Kornakov
*Assistant Examiner*—Matthew J Song
(74) *Attorney, Agent, or Firm*—Greenblum & Bernstein, P.L.C.

(57) ABSTRACT

There is provided a silicon wafer surface defect evaluation method capable of readily detecting a region where small crystal defects exist, the evaluation method comprising: a rapid heat treatment step of a silicon wafer from a silicon single-crystal ingot in an atmosphere which can nitride silicon at a temperature elevating speed of 10 to 150° C./second from a room temperature to temperatures between not lower than 1170° C. and less than a silicon melting point, holding the silicon wafer at the processing temperature for 1 to 120 seconds and then cooling the silicon wafer to the room temperature at a temperature lowering speed of 10 to 100° C./second; and a step of using a surface photo voltage method to calculate a minority carrier diffusion length on the wafer surface, thereby detecting a region on the wafer surface in which small COP's which cannot be detected at least by a particle counter exist.

5 Claims, 6 Drawing Sheets

U.S. PATENT DOCUMENTS

| | | | |
|---|---|---|---|
| 5,773,989 | A | 6/1998 | Edelman et al. |
| 5,804,981 | A | 9/1998 | Lowell et al. |
| 6,197,606 | B1 | 3/2001 | Polignano et al. |
| 6,254,672 | B1 | 7/2001 | Falster et al. |
| 6,512,384 | B1 | 1/2003 | Lagowski et al. |
| 6,569,691 | B1 | 5/2003 | Jastrzebski et al. |
| 6,922,067 | B1 | 7/2005 | Van et al. |
| 7,147,711 | B2 * | 12/2006 | Tamatsuka et al. ............ 117/13 |
| 2001/0025597 | A1 | 10/2001 | Falster et al. |
| 2002/0007779 | A1 | 1/2002 | Mule et al. |
| 2004/0053516 | A1 * | 3/2004 | Nakada et al. .............. 438/795 |
| 2004/0194692 | A1 | 10/2004 | Nishikawa et al. |
| 2005/0103256 | A1 | 5/2005 | Sadamitsu et al. |
| 2006/0130738 | A1 | 6/2006 | Kurita et al. |

FOREIGN PATENT DOCUMENTS

| | | |
|---|---|---|
| EP | 0898298 | 2/1999 |
| EP | 0 964 443 | 12/1999 |
| EP | 1559812 | 8/2005 |
| JP | 2001-081000 | 3/2001 |
| JP | 2001-217251 | 8/2001 |
| JP | 2001-274167 | 10/2001 |
| WO | 98/45507 | 10/1998 |

OTHER PUBLICATIONS

English language Abstract of JP 2001-217251.
English language Abstract of JP 2001-274167.
Slaoui A et al., "Rapid thermal diffusion of phosphorus into silicon from doped oxide films (solar cell manufacture)", Proceedings of the Photovoltaic Specialists Conference. Las Vegas, Oct. 7-11, 1991, [Proceedings of the Photovoltaic Specialists Conference], New York, IEEE, US, vol. Conf. 22, Oct. 7, 1991, pp. 445-449, XP010039210, ISBN: 978-0-87942-636-1.
Porrini Et Rossetto, "Influence of thermal history during Czochralski silicon crystal growth on OISF nuclei formation", Material Science and Engineering, vol. B36, 1996, pp. 162-166, XP002531516.
English abstract of JP 2001-081000, Mar. 27, 2001.

* cited by examiner

▨ NOT SMALLER THAN 600 mm AND LESS THAN 700 mm
☐ NOT SMALLER THAN 500 mm AND LESS THAN 600 mm
▨ NOT SMALLER THAN 400 mm AND LESS THAN 500 mm
■ NOT SMALLER THAN 300 mm AND LESS THAN 400 mm

▨ NOT SMALLER THAN 600 mm AND LESS THAN 700 mm
☐ NOT SMALLER THAN 500 mm AND LESS THAN 600 mm
▩ NOT SMALLER THAN 400 mm AND LESS THAN 500 mm
▦ NOT SMALLER THAN 300 mm AND LESS THAN 400 mm

▦ NOT SMALLER THAN 700 mm AND LESS THAN 800 mm
▓ NOT SMALLER THAN 600 mm AND LESS THAN 700 mm
☐ NOT SMALLER THAN 500 mm AND LESS THAN 600 mm

SILICON WAFER SURFACE DEFECT EVALUATION METHOD

BACKGROUND OF THE INVENTION

1. Field of the Invention

The present invention relates to a method of evaluating a surface defect of a silicon wafer cut out from a silicon single-crystal ingot (which will be referred to as an ingot hereinafter). More particularly, the present invention relates to a silicon wafer surface defect evaluation method which facilitates manufacture of a defect-free region silicon wafer cut out from an ingot grown by a Czochralski method (which will be referred to as a CZ method hereinafter).

2. Description of the Related Art

With recent ultra-miniaturization of a semiconductor integrated circuit, as a factor which lowers a yield of a device, there is a crystal originated particle (which will be referred to as a COP hereinafter) which is a defect introduced in crystal growth, i.e., a defect formed in crystal growth of a silicon single-crystal ingot, a small defect of an oxygen precipitate which becomes a nucleus of an oxidation induced stacking fault (which will be referred to as an OISF hereinafter), or interstitial-type large dislocation (which will be referred to as L/D hereinafter).

The COP is a crystal originated pit which appears on a wafer surface when a mirror-polished silicon wafer is subjected to SC-1 cleaning using a mixed liquid of ammonia and hydrogen peroxide. When this wafer is measured by using a particle counter, this pit is detected as a particle (a light point defect, an LPD). The COP can be a factor which deteriorates electrical characteristics, e.g., time dependent dielectric breakdown (TDDB) characteristics of an oxide film, time zero dielectric breakdown (TZDB) characteristics and others. Further, when the COP exists on a wafer surface, steps may be generated in a device wiring process, resulting in disconnection. Furthermore, the COP can be a factor of leak or the like in an element isolation portion to lower a yield of a product.

In regard to the OISF, it is considered that a small oxygen precipitate formed in crystal growth is a nucleus, and the OISF is a stacking fault which is elicited in a thermal oxidation process or the like in manufacturing a semiconductor device. This OISF causes a defect, e.g., an increase in a leak current of a device. The L/D is also called a dislocation cluster or a dislocation pit since an etching pit having a direction is generated when a silicon wafer having this defect is dipped in a selective etchant mainly containing fluorinated acid. This L/D can be also a factor which deteriorates electrical characteristics, e.g., leak characteristics, isolation characteristics and others.

Based on the above-described facts, it is necessary to reduce the COP, the OISF and the L/D from a silicon wafer which is used to manufacture a semiconductor integrated circuit. Although various methods exist as methods of evaluating such crystal defects, there has been disclosed a crystal defect evaluation method of a silicon single-crystal using a copper decoration method which contaminates a sample surface with copper, diffuses copper into the sample by a heat treatment and then rapidly cools the sample to elicit defects on the crystal surface as a method of evaluating a small defect in particular (see, e.g., Patent Reference 1). In this method disclosed in Patent Reference 1, a region where an OISF or a nucleus which becomes an OISF exist is detected.

Further, there has been disclosed a wafer defect analysis method comprising a step of forming an insulating film having a predetermined thickness on a bare wafer to form an insulating film whose thickness has been changed with respect to a defective part of the wafer and a step of destroying a part of the insulating film whose thickness has been changed on the defective part by electrolysis and decorating copper on the defective part (see, e.g., Patent Reference 2). In the method disclosed in Patent Reference 2, a defect on a semiconductor wafer subjected to crystal growth can be directly analyzed with the naked eye.

Patent Reference 1: Japanese Patent Application laid-open No. 2001-81000 (claim 1)

Patent Reference 2: Japanese Patent No. 3241296 (claim 1, paragraph [0015])

However, the evaluation method using the copper decoration method disclosed in Patent Reference 1 or Patent Reference 2 can detect a COP whose size is less than a detection lower limit of a particle counter, but it is complicated since many steps are required for measurement, and hence there has been a problem that an evaluation throughput is poor and a cost is high.

SUMMARY OF THE INVENTION

It is an object of the present invention to provide a silicon wafer surface defect evaluation method capable of readily detecting a region where a small crystal defect exists.

It is another object of the present invention to provide a silicon wafer surface defect evaluation method which facilitates manufacture of a silicon wafer formed of a defect-free region.

It is still another object of the present invention to provide a silicon wafer formed of a defect-free region.

To achieve these objects, according to the present invention defined in claim 1, there is provided a silicon wafer surface defect evaluation method comprising: a rapid heat treatment step of applying a heat treatment to a silicon wafer cut out from a silicon single-crystal ingot in an atmosphere which can nitride silicon at a temperature elevating speed of 10 to 150° C./second from a room temperature to temperatures between not lower than 1170° C. and less than a silicon melting point, holding the silicon wafer at the processing temperature for 1 to 120 seconds and then cooling the silicon wafer to the room temperature at a temperature lowering speed of 10 to 100° C./second; and a step of calculating a minority carrier diffusion length on a wafer surface by using a surface photo voltage method (which will be referred to as an SPV method hereinafter) to detect a region on the wafer surface where small COP's which cannot be detected at least by a particle counter exist.

According to the present invention defined in claim 1, when a nitride film is generated on the wafer surface layer by applying the rapid heat treatment in the atmosphere which can nitride silicon under the above-described conditions, vacancies are injected into the wafer from the wafer surface. Defect in the region where the small COP's exist are coupled with the injected vacancies by heat simultaneously with the vacancy injection, and this coupling effectively acts as the center of re-coupling of the minority carrier As a result, in the region on the wafer surface where the small COP's which cannot be detected at least by the particle counter exist, a short diffusion length is detected. Calculating the minority carrier diffusion length on the wafer in this state by using the SPV method, since the COP's further effectively act as the center of re-coupling of the carrier, the region on the water surface where the small COP's which cannot be detected at least by the particle counter exist can be readily detected.

According to the present invention defined in claim 2, there is provided, in the invention according to claim 1, the method further comprising a step of performing HF processing with respect to the wafer surface before the step of detecting the region on the wafer surface where the small COP's which cannot be detected at least by the particle counter exist when the silicon wafer is a p-type semiconductor.

According to the present invention defined in claim 2, since silicon in the wafer surface layer can be terminated with hydrogen by performing HF processing with respect to the wafer surface when the wafer is the p-type semiconductor, the region on the wafer surface where the small COP's which cannot be detected by the particle counter exist can be readily detected by measurement of the small carrier diffusion length using the SPV method.

According to the present invention defined in claim 3, there is provided, in the invention according to claim 1, the method, wherein the wafer cut out from the silicon single-crystal is a wafer consisting of a perfect region [P], a P-band region and a region [Vs], where [I] is a region where interstitial silicon point defect agglomerates exist in the silicon single-crystal ingot, [V] is a region where vacancy point defect agglomerates exist, [P] is a perfect region in which the interstitial silicon point defect agglomerates and the vacancy point defect agglomerates do not exist, the P-band region is a region which exists at a boundary of the region [V] on a side adjacent to the region [P] and where an OISF nucleus is formed, and the region [Vs] is a region which exists at a boundary of the region [V] on a side adjacent to the P-band region and has small COP's which cannot be detected by a particle counter.

According to the present invention defined in claim 4, there is provided, in the invention according to claim 3, the method, wherein the wafer cut out from the silicon single-crystal ingot is a wafer consisting of a mixed region of a region [Pv] and a region [Pi], the P-band region and the region [Vs], where [Pi] is a region which is adjacent to the region [I], belongs to the perfect region [P] and has an interstitial silicon concentration which is less than a minimum interstitial silicon concentration which allows formation of interstitial-type large dislocation, and [Pv] is a region which is adjacent to the region [V], belongs to the perfect region [P] and has a vacancy concentration which is not greater than a vacancy concentration which allows formation of COP's or FPD's.

According to the present invention defined in claim 5, there is provided, in the invention according to claim 1, the method, wherein, assuming that [I] is a region in which interstitial silicon is dominant and which has defects of interstitial silicon agglomerates, when a heat treatment is applied to a wafer which does not include the region [I] in an atmosphere which can nitride silicon at a temperature elevating speed of 10 to 150° C./second from a room temperature to temperatures between not lower than 1170° C. and less than a silicon melting point and an SPV method is used to calculate a minority carrier diffusion length on a surface of the wafer cooled to the room temperature at a temperature lowering speed of 10 to 100° C./second after holding the wafer at the processing temperature for 1 to 120 seconds, the wafer before the heat treatment is evaluated based on whether the minority carrier diffusion length on the entire surface of the wafer falls within a range of 500 to 800 µm.

According to the present invention defined in claim 5, when the rapid heat treatment is applied to the wafer which does not include the region [I] under the above-described conditions and then the minority carrier diffusion length is calculated by the SPV method, the wafer before the heat treatment is evaluated based on whether the minority carrier diffusion length on the entire surface of the wafer falls within a range of 500 to 800 µm If the minority carrier diffusion length falls within the above-described range, it can be determined that the wafer as an evaluation target which does not include the region [I] is a wafer consisting of a defect-free region According to the present invention defined in claim 6, there is provided a silicon wafer, wherein the silicon wafer is a wafer which does not include a region [I], [I] being a region in which interstitial silicon is dominant and which has interstitial silicon agglomerates, wherein when a heat treatment is applied to the water in an atmosphere which can nitride silicon at a temperature elevating speed of 10 to 150° C./second from a room temperature to temperatures between not lower than 1170° C. and less than a silicon melting point, the wafer is held at the processing temperature for 1 to 120 seconds and then a surface photo voltage method is used to calculate a minority carrier diffusion length on a surface of the wafer cooled to the room temperature at a temperature lowering speed of 10 to 100° C./second, the minority carrier diffusion length on the entire surface of the wafer falls within a range of 500 to 800 µm.

According to the present invention defined in claim 6, there is provided a silicon wafer as a wafer which does not include a region [I] and consists of a defect-free region if a minority carrier diffusion length on an entire surface of the wafer falls within a range of 500 to 800 µm Such a wafer is preferable as a silicon wafer which is used to manufacture a semiconductor integrated circuit.

In the silicon wafer surface defect evaluation method according to the present invention, when a nitride film is generated on a wafer surface layer by applying a rapid heat treatment in an atmosphere which can nitride silicon under predetermined heating conditions, vacancies are injected into the wafer from the wafer surface. Defect existing in a region where small COP's exist are coupled with the injected vacancies by heat simultaneously with this vacancy injection, and this coupling effectively acts as a center of re-coupling of a minority carrier. As a result, in a region on the wafer surface where small COP's which cannot be detected at least by a particle counter exist, a short diffusion length is detected. When a minority carrier diffusion length on the wafer in this state is calculated by using the SPV method, since the COP's further effectively act as the center of re-coupling of the carrier, the region on the wafer surface in which the small COP's which cannot be detected at least by the particle counter exist can be readily detected. Moreover, since information such as a distribution with respect to crystal defects on the wafer can be accurately recognized, it is possible to conduct an examination to suppress generation of crystal defects from an initial stage of manufacture of the wafer based on such information, thereby facilitating production of the silicon wafer consisting of a defect-free region.

The silicon wafer according to the present invention is a wafer which does not include the region [I] and characterized in that a minority carrier diffusion length on an entire surface of the wafer falls within a range of 500 to 800 µm when the minority carrier diffusion length is calculated by using the surface photo voltage method on the wafer surface subjected to the rapid heat treatment in the atmosphere which can nitride silicon under the predetermined conditions. In the wafer which does not include the region [I], if the minority carrier diffusion length on the entire surface of the wafer falls within a range of 500 to 800 µm, the silicon wafer consisting of a defect-free region can be obtained. Such a wafer is preferable as a silicon wafer used for manufacture of a semiconductor integrated circuit.

DETAILED DESCRIPTION OF THE PREFERRED EMBODIMENTS

Figure 1:
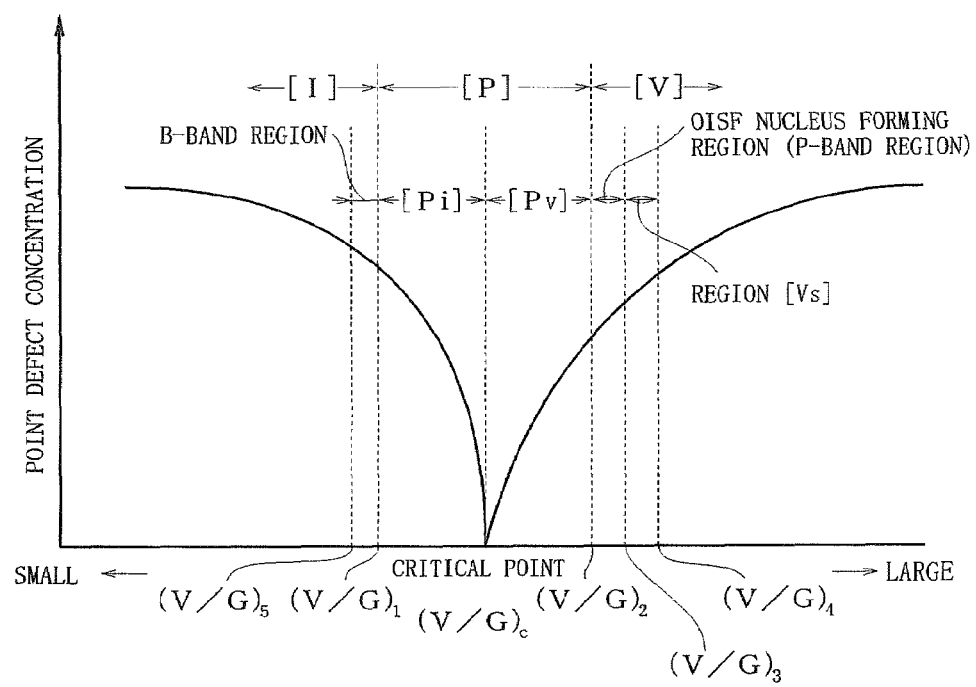
FIG. 1 is a view showing a relationship between V/G and a point defect concentration based on Voronkov's theory in which a horizontal axis represents the V/G and a vertical axis represents both a vacancy point defect concentration and an interstitial silicon point defect concentration.

The best mode for carrying out the present invention will now be described.

A silicon wafer surface defect evaluation method according to the present invention is characterized by comprising: a rapid heat treatment step of applying a heat treatment to a silicon wafer cut out from a silicon single-crystal ingot in an atmosphere which can nitride silicon at a temperature elevating speed of 10 to 150° C./second from a room temperature to temperatures between not lower than 1170° C. and less than a silicon melting point, holding the silicon wafer at the treatment temperature for 1 to 120 seconds and then cooling the silicon wafer to the room temperature at a temperature lowering speed of 10 to 100° C./second; and a step of calculating a minority carrier diffusion length on a wafer surface by using a surface photo voltage method to detect a region on the wafer surface in which small COP's which cannot be detected at least by a particle counter exists As a silicon wafer which is an evaluation target in the evaluation method according to the present invention, it is preferable for a wafer cut out from a silicon single-crystal ingot to be a wafer consisting of a perfect region [P], a P-band region and a region [Vs], where [I] is a region where interstitial silicon point defect agglomerates exist in the silicon single-crystal ingot, [V] is a region where vacancy point defect agglomerates exist, [P] is a perfect region where the interstitial silicon point defect agglomerates and the vacancy point defect agglomerates do not exist, the P-band region is a region which exists at a boundary of the region [V] on a side adjacent to the region [P] and where an OISF nucleus is formed, and the region [Vs] is a region which exists at a boundary of the region [V] on a side adjacent to the P-band region and where small COP's which cannot be detected by a particle counter exist. Such a wafer is preferable for the surface defect evaluation method according to the present invention since COP's cannot be detected by a particle counter, i.e., only COP's whose size is less than a detection lower limit of the particle counter exist in this wafer. Here, the phrase "cannot be detected by a particle counter" means that the detected number of the COP's which are not smaller than 0.065 μm is substantially zero. In this specification, a "COP which is 0.065 μm" means a COP having a value of 0.065 μm when measured by an SP1 manufactured by KLA-Temcor corporation and a particle counter having performance equivalent to that of this device.

In particular, in regard to the silicon wafer which is an evaluation target, it is preferable for a wafer cut out from a silicon single-crystal ingot to be a wafer consisting of a mixed region of a region [Pv] and a region [Pi], the P-band region and the region [Vs], where [Pi] is a region which is adjacent to the region [I], belongs to the perfect region [P] and has an interstitial silicon concentration which is less than a minimum interstitial silicon concentration allowing formation of interstitial-type large dislocation, and [Pv] is a region which is adjacent to the region [V], belongs to the perfect region [P] and has a vacancy concentration which is less than a vacancy concentration allowing formation of COP's or FPD's.

Such a silicon wafer is manufactured by pulling up an ingot from a silicon melt in a hot zone furnace with a predetermined pull-up speed profile based on a Voronkov's theory by a CZ method and slicing this ingot In general, when a silicon single-crystal ingot is pulled up from a silicon melt in a hot zone furnace by a CZ method or an MCZ method, point defects and agglomerates (three-dimensional defects) of point defects are generated as defects in the silicon single-crystal. The point defect has two general conformations, i.e., a vacancy type point defect and an interstitial silicon type point defect. The vacancy type point defect is produced when one silicon atom separates from one of normal positions in a silicon crystal lattice. Such a vacancy becomes a vacancy type point defect. On the other hand, when an atom is found at a position other than a lattice point of the silicon crystal (an interstitial site), this becomes an interstitial silicon point defect.

The point defect is generally introduced on a contact face between a silicon melt (molten silicon) and an ingot (a solid ingot). However, a part which is the contact face is cooled with a continuous pull-up operation of the ingot. In a cooling period, the vacancy or interstitial silicon diffuses or demonstrates a pair annihilation reaction. Excessive point defects when cooled down to approximately 1100° C. form vacancy point defect agglomerates or interstitial silicon point defect agglomerates In other words, the excessive point defects have a three-dimensional structure which forms and generates agglomerates.

The vacancy point defect agglomerates include a defect which is called an LSTD (Laser Scattering Tomograph defect) or an FPD (Flow Pattern Defect) as well as the COP, and the interstitial silicon point defect agglomerates include a defect called the L/D. The FPD is a source of a mark showing a peculiar flow pattern which appears when a silicon wafer manufactured by slicing an ingot is subjected to Secco etching (etching by a liquid mixture of HF: $K_2Cr_2O_7$ (0.15 mol/l)=2:1) for 30 minutes, and the LSTD is a source which has a refraction factor different from that of silicon when irradiating silicon single-crystal with an infrared light and generates a scattered light.

According to the Voronkov's theory, in order to grow a high-purity ingot having less defects, V/G (mm²/min·° C.) is controlled, where V (mm/min) is a pull-up speed of the ingot and G (° C./mm) is a temperature gradient in the vicinity of a solid-liquid interface of the silicon melt and the silicon ingot. In this theory, as shown in FIG. 1, a horizontal axis represents V/G whilst a vertical axis represents both a vacancy concentration and an interstitial concentration to diagrammatically express a relationship between V/G and point defect concentrations and illustrate that a boundary between a vacancy region and an interstitial silicon region is determined by V/G. In more detail, an ingot with an increased vacancy concentration is formed when a V/G ratio is not smaller than a critical point $(V/G)_c$, whereas an ingot with an increased interstitial concentration is formed when a V/G ratio is not greater than $(V/G)_c$. In FIG. 1, [I] represents a region (not greater than $(V/G)_1$) in which the interstitial silicon is dominant and which has defects as agglomerates of the interstitial silicon; [V], a region (not smaller than $(V/G)_2$) in which the vacancies are dominant and which has defects as agglomerates of vacancies; and [P], a perfect region $((V/G)_c$ to $(V/G)_2)$ in which vacancy point defect agglomerates and interstitial silicon point defect agglomerates do not exist. A P-band region $((V/G)_2$ to $(V/G)_3)$ which forms an OISF nucleus exists at a boundary of the region [V] on the side adjacent to the region [P]. In the P-band region, small tabular precipitates exist, and OISFs (stacking faults) are formed by a heat treatment in an oxidizing atmosphere. Specifically, when a heat treatment is carried out for 2 to 5 hours at a temperature of 1000° C.±30° C. in an oxygen atmosphere and the heat treatment is continuously performed for 1 to 16 hours at a temperature of 1130° C.±30° C., the OISFs can be elicited. Further, a region [Vs] $((V/G)_3$ to $(V/G)_4)$ in which small COP's which cannot be detected by a particle counter exist is present at a boundary of the region [V] on the side adjacent to this P-band region. Furthermore, a B-band region $((V/G)_5$ to $(V/G)_1)$ exists at a boundary of the region [I] on the side adjacent to the region [P]. The B-band region is a region in which interstitial silicon agglomerates serve as nuclei and highly concentrated oxygen precipitation is generated by a heat treatment.

This perfect region [P] is further classified into a region [Pi] and a region [Pv]. [Pi] is a region in which the V/G ratio ranges from $(V/G)_1$ mentioned above to the critical point, the interstitial silicon is dominant and defects of agglomerates do not exist. [Pv] is a region in which the V/G ratio ranges from the critical point to $(V/G)_2$ mentioned above, vacancies are dominant and defects of agglomerates do not exist. That is, [Pi] is a region which is adjacent to the region [I] and has an interstitial silicon concentration which is less than a minimum interstitial silicon concentration with which interstitial-type large dislocation can be formed, and [Pv] is a region which is adjacent to the region [V] and has a vacancy concentration which is less than a minimum vacancy concentration with which an OISF nucleus can be formed.

Therefore, a silicon wafer consisting of the perfect region [P], the P-band region and the region [Vs] is cut out from an ingot which is controlled and pulled up in such a manner that a V/G ratio includes a range of $(V/G)_1$ to $(V/G)_2$, a range of $(V/G)_2$ to $(V/G)_3$ and a range of $(V/G)_3$ to $(V/G)_4$ and is composed of these three ranges alone. Moreover, a silicon wafer consisting of a mixed region of the region [Pv] and the region [Pi], the P-band region and the region [Vs] is cut out from an ingot controlled and pulled up in such a manner that a V/G ratio includes a range of $(V/G)_1$ to a critical point $(V/G)_c$, a range of the critical point $(V/G)_c$ to $(V/G)_2$, a range of $(V/G)_2$ to $(V/G)_3$ and a range of $(V/G)_3$ to $(V/G)_4$ and is composed of these four ranges alone. However, among the pulled-up ingots, there are a very small number of ingots which are pulled up to include regions other than those described above due to various factors in operations even though an operation is performed to pull up an ingot while controlling a V/G ratio to include the above-described ranges and to be composed of these ranges. The evaluation method according to the present invention can readily evaluate a wafer which cannot be satisfactorily controlled in a manner mentioned above.

As a silicon wafer which is an evaluation target of the present invention, it is possible to use a wafer cut out from an ingot and subjected to mechanical polishing, or a wafer subjected to mechanical polishing and further subjected to etching.

In a surface defect evaluation method according to the present invention, a silicon wafer is subjected to a heat treatment in an atmosphere which can nitride silicon at a temperature elevating speed of 10 to 150° C./second from a room temperature to temperatures between not lower than 1170° C. and less than a silicon melting point, held at the processing temperature for 1 to 120 seconds, and then cooled to the room temperature at a temperature lowering speed of 10 to 100° C./second. When the rapid heat treatment is applied to the silicon wafer in the atmosphere which can nitride silicon under the high-temperature heating conditions, generation of a nitride film on a wafer surface layer allows injection of vacancies into the wafer from the wafer surface. Each defect existing in a region where small COP's exist is coupled with each injected vacancy by heat simultaneously with this vacancy injection, and this coupling effectively acts as the center of re-coupling of a minority carrier. As a result, in the region where small COP's which cannot be detected at least by a particle counter exist in a wafer plane, a short diffusion length is detected.

It is good enough for the atmosphere which can nitride silicon in the present invention to allow generation of the nitride film on the wafer surface layer by the rapid heat treatment under the above-described conditions. As a specific atmosphere which can nitride silicon, there is an $NH_3$ gas, an $N_2$ gas, an $N_2O$ gas, an NO gas, or a mixed gas atmosphere containing these gases and an inert gas. The temperature elevating speed is set to 10 to 150° C./second because an inconvenience of poor productivity occurs when the temperature elevating speed is less than 10° C./second but the speed can be assuredly controlled when the temperature elevating speed is up to 150° C./second. The processing temperature ranges from 1170° C. to a temperature which is less than a silicon melting point. When the processing temperature is less than 1170° C., injection of vacancies into the wafer based on generation of the nitride film is not sufficient. The holding time is 1 to 120 seconds. The nitride film cannot be sufficiently formed on the wafer surface layer when the holding time is less than 1 second, and productivity becomes poor when the holding time exceeds 120 seconds. The temperature lowering speed is 10 to 100° C./second or, preferably, 70 to 100° C./second. The temperature lowering speed is set to 10 to 100° C./second because vacancies once injected into the wafer diffuse on the surface of the wafer when the temperature lowering speed is less than 10° C./second, but the speed up to 100° C./second can be assuredly controlled.

When the silicon wafer is a p-type semiconductor, it is preferable to perform HF processing with respect to a wafer surface before a subsequent step of detecting a region on the wafer surface where small COP's which cannot be detected at least by a particle counter exist. When HF processing is carried out with respect to the p-type wafer surface, silicon in the wafer surface layer is terminated with hydrogen, and hence the region in which small COP's which cannot be detected by the particle counter exist can be readily detected by subsequent minority carrier diffusion length measurement based on an SPV method.

Then, calculating a minority carrier diffusion length on the wafer surface by using the SPV method allows detection of a region on the wafer surface where small COP's which cannot be detected at least by a particle counter exist. The SPV method is a method which activates the silicon wafer surface by light irradiation or heating to measure a change in a minority carrier diffusion length due to this activation. Since surface defects existing in the silicon wafer subjected to the rapid heat treatment more effectively act as the center of re-coupling of the carrier as compared with surface defects in a wafer which is not subjected to the rapid heat treatment, calculating the minority carrier diffusion length by using the SPV method can detect a region on the wafer surface where COP's exist. As a device used for the SPV method conducted in the present invention, FAaST330 manufactured by SDI is preferable, and a device having equivalent functions can be applied. Additionally, since information such as a distribution of crystal defects on a wafer can be accurately recognized, it is possible to perform an examination based on such information so as to allow suppression of occurrence of crystal defects from the initial stage of manufacture of the wafer, thereby facilitating production of the silicon wafer consisting of a defect-free region. It is to be noted that the silicon wafer consisting of a defect-free region means a wafer which does not include the region [I], the B-band region, the P-band region, the region [Vs] and the region [V] but consists of the region [Pv], the region [Pi] or a mixed region of the region [Pv] and the region [Pi].

Additionally, a wafer which does not include the region [I] is subjected to a heat treatment in an atmosphere which can nitride silicon at a temperature elevating speed of 10 to 150° C./second from a room temperature to temperatures between not lower than 1170° C. and less than a silicon melting point, the wafer is held at the processing temperature for 1 to 120 seconds, and then a minority carrier diffusion length is calculated on a surface of the wafer cooled to the room temperature at a temperature lowering speed of 10 to 100° C./second by the SPV method. At this time, if the minority carrier diffusion length falls within a range of 500 to 800 μm in evaluation of the wafer before the heat treatment based on whether the minority carrier diffusion length falls within this range, it can be determined that the wafer as the evaluation target which does not include the region [I] is a wafer consisting of a defect-free region.

Assuming that [I] is a region in which interstitial silicon is dominant and defects of interstitial silicon agglomerates exist, the silicon wafer according to the present invention is a wafer which does not include the region [I]. This silicon wafer is characterized in that a minority carrier diffusion length on an entire surface of the wafer falls within a range of 500 to 800 μm when the wafer is subjected to a heat treatment in an atmosphere which can nitride silicon at a temperature elevating speed of 10 to 150° C./second from a room temperature to temperatures between not lower than 1170° C. and less than a silicon melting point, the silicon wafer is held at the processing temperature for one to 120 seconds and then the minority carrier diffusion length is calculated on the surface of the silicon wafer cooled to the room temperature at a temperature lowering speed of 10 to 100° C./second by using an SPV method. If the wafer is a wafer which does not include the region [I] and a minority carrier diffusion length on an entire surface of the wafer falls within a range of 500 to 800 μm, the wafer consisting of a defect-free region can be obtained. Such a wafer is preferable as a silicon wafer used to manufacture a semiconductor integrated circuit.

According to such a silicon wafer, at the time of pulling up a silicon single-crystal ingot from a silicon melt in a hot zone furnace by a CZ method or an MCZ method, the ingot is controlled and pulled up in such a manner that V/G (mm$^2$/min·° C.) falls within such a range of $(V/G)_1$ to a critical point $(V/G)_c$ as shown in FIG. 1, or controlled and pulled up in such a manner that V/G (mm$^2$/min·° C.) falls within a range of the critical point $(V/G)_c$ to $(V/G)_2$, or controlled and pulled up in such a manner that V/G (mm$^2$/min·° C.) falls within both a range of $(V/G)_1$ to the critical pint $(V/G)_c$ and a range of the critical point $(V/G)_c$ to $(V/G)_2$. When the wafer cut out from such an ingot is subjected to a rapid heat treatment under the above-described conditions and then a minority carrier diffusion length is calculated by the SPV method, the minority diffusion length falls within a range of 500 to 800 μm.

Examples and Comparative Examples of the present invention will now be described in detail.

EXAMPLE 1

First, as shown in FIG. 1, a p-type silicon single-crystal ingot was pulled up, the ingot having a V/G ratio including a range of $(V/G)_1$ to a critical point $(V/G)_c$ and a range of the critical point $(V/G)_c$ to $(V/G)_2$, being controlled in such a manner that the V/C ratio consists of these ranges alone, and having a body portion with a diameter of 300 mm. This ingot was subjected to block cutting, external diameter grinding and orientation notch machining, and then it was sliced with a predetermined thickness, thereby a p-type silicon wafer having a diameter of 300 mm being cut out. A surface of this wafer was machine-polished to increase the parallelism, and thus an evaluation target wafer was provided.

Then, as a rapid heat treatment step, the wafer was put into a heat treatment furnace having an atmosphere which can nitride silicon by introducing a mixed gas containing an $NH_3$ gas and an Ar gas at a ratio of 20:80, a heat treatment was performed at a temperature elevating speed of 50° C./second from a room temperature to 1175° C., and the wafer was held at 1175° C. for 10 seconds. Subsequently, the wafer was cooled to the room temperature at a temperature lowering speed of 10° C./second. Then, the wafer subjected to the rapid heat treatment was brought into contact with an HF solution so that silicon in a wafer surface layer was terminated with hydrogen. Subsequently, an SPV device (a model name: FAaST330 manufactured by SDI) was used to calculate a minority carrier diffusion length on the wafer surface. A measurement range of the diffusion length is 1 to 2.5-fold (approximately 1900 μm) of a wafer thickness. The minority carrier diffusion length on the wafer surface was calculated by dividing a region on the wafer surface into small regions each having a size of 15×15 and classifying the respective small regions based on a range which is not smaller than 300 μm and less than 400 μm, a range which is not smaller than 400 μm and less than 500 μm, a range which is not smaller than 500 μm and less than 600 μm, a range which is not smaller than 600 μm and less than 700 μm and a range which is not smaller than 700 μm and less than 800 μm to which the minority carrier diffusion length belongs.

EXAMPLE 2

Surface defects on a wafer surface were detected like Example 1 except that a wafer cut out from a lot different from that of the wafer used in Example 1 was utilized as a measurement sample. That is, the wafer as an evaluation target in Example 2 is a wafer cut out from an ingot pulled up in a lot different from that of the ingot pulled up in Example 1. As shown in FIG. 1, like the ingot pulled up in Example 1, the ingot is a p-type silicon single-crystal ingot having a body portion with a diameter of 300 mm controlled in such a manner that a V/G ratio includes a range of $(V/G)_1$ to a critical point $(V/G)_c$ and a range of the critical point $(V/G)_c$ to $(V/G)_2$ and is composed of these ranges alone as pull-up conditions.

EXAMPLE 3

Surface defects on a wafer surface were detected like Example 1 except that a wafer cut out from a lot different from that of the wafers used in Examples 1 and 2 was utilized as a measurement sample. That is, the wafer as an evaluation target in this Example 3 is a wafer cut out from an ingot pulled up in a lot different from that of the ingots pulled up in Examples 1 and 2. Like the ingots pulled up in Examples 1 and 2, as shown in FIG. 1, the ingot is a p-type silicon single-crystal ingot having a body portion with a diameter of 300 mm controlled in such a manner that a V/G ratio includes a range of $(V/G)_1$ to a critical point $(V/G)_c$ and a range of the critical point $(V/G)_c$ to $(V/G)_2$ and is composed of these ranges alone as pull-up conditions of the ingot Comparative Example 1

Two wafers cut out from the same lot as that of the wafer used in Example 1 were prepared, and one wafer was determined as a dummy wafer whilst the other wafer was determined as a measurement wafer. First, wafer cleaning was performed by using a cleaning agent in which SC1 and HF are mixed to remove external contamination sources such as a particle existing on surfaces. Then, each wafer was subjected to thermal oxidization to form a thermally-oxidized film having a thickness of 1000 Angstrom. Then, bringing a rear surface of each wafer into contact with steam of hydrogen fluoride allowed etching, thereby removing a part of the thermally-oxidized film on the rear surface. Subsequently, a decoration device which constitutes a predetermined space with upper and lower copper plates and a side wall was prepared. Connection terminals are coupled with the upper and lower plates of this device, and a voltage is variably applied by an external power supply, thereby forming a fixed electric field between the plates. The dummy wafer was attached to the lower plate in this device. Then, methanol as an electrolytic material was injected into a space in the device, a voltage of 5 MV/cm was applied to the upper and lower plates for one hour to oxidize copper of the plates, whereby copper was ionized in methanol. Subsequently, after removing the dummy wafer, the measurement wafer was attached in the device. A voltage of 5 MV/cm was applied to the upper and lower plates for one hour to decorate defective parts of the wafer with a copper ion. The wafer subjected to decoration was removed from the device and visually observed, and surface defects existing on the wafer surface were counted.

Comparative Example 2

Two wafers cut out from the same lot as that of the wafer used in Example 2 were prepared. Surface defects on a wafer surface were detected by a copper decoration method like Comparative Example 1 except that one wafer was determined as a dummy wafer and the other wafer was used as a measurement wafer.

Comparative Example 3

Two wafers cut out from the same lot as that of the wafer used in Example 3 were prepared. Surface defects on a wafer surface were detected by a copper decoration method like Comparative Example 1 except that one wafer was determined as a dummy wafer and the other wafer was used as a measurement wafer.

Comparative Test 1

Figure 2:
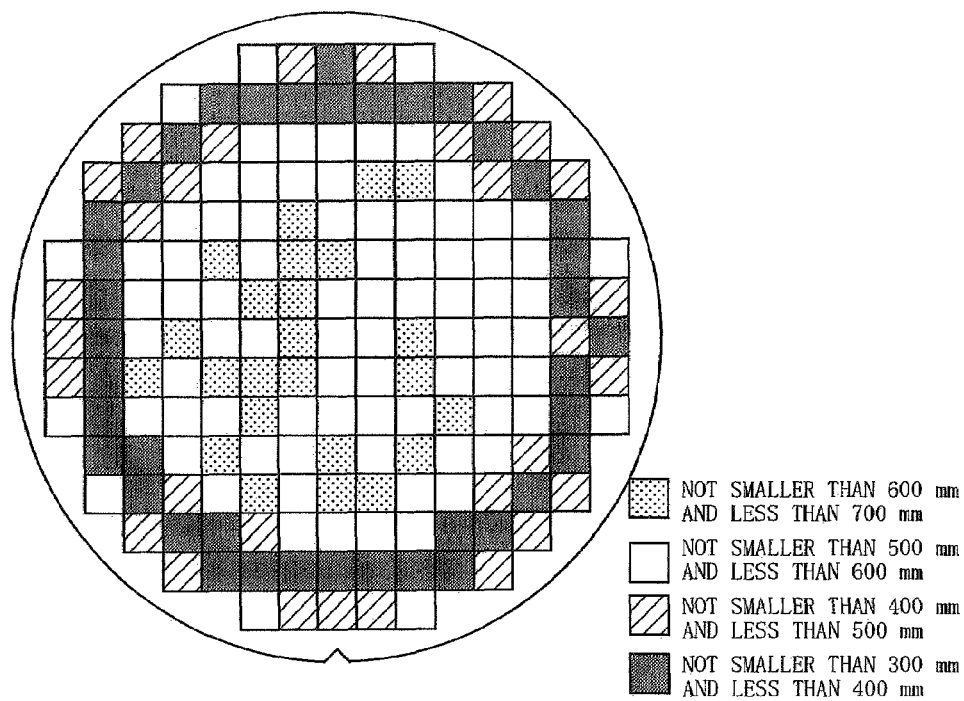
FIG. 2 is a distribution chart showing a minority carrier diffusion length in a wafer plane according to Example 1.
Figure 3:
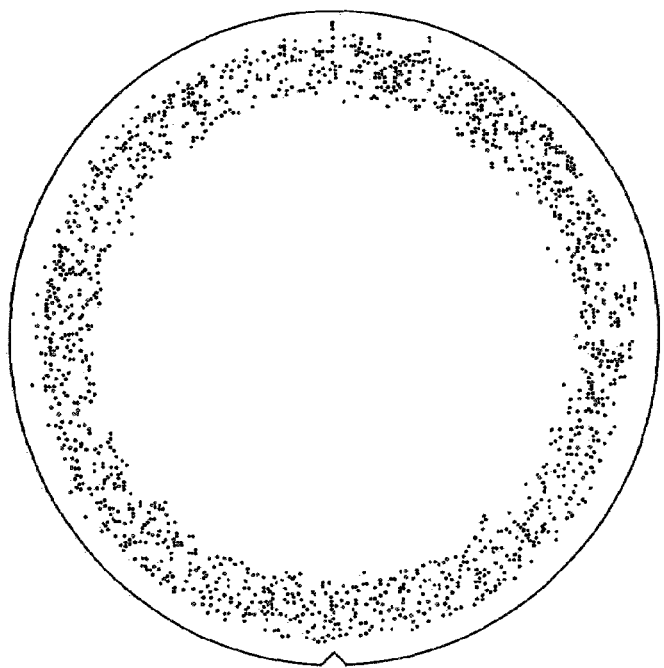
FIG. 3 is a distribution chart showing surface defects using a copper decoration method according to Comparative Example 1.
Figure 4:
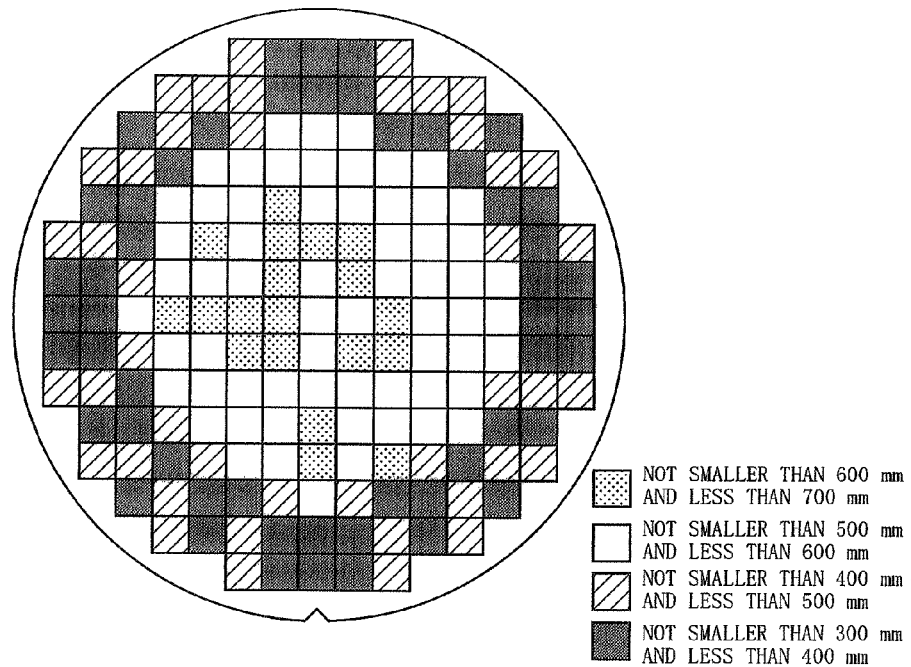
FIG. 4 is a distribution chart showing a minority carrier diffusion length in a wafer plane according to Example 2.
Figure 5:
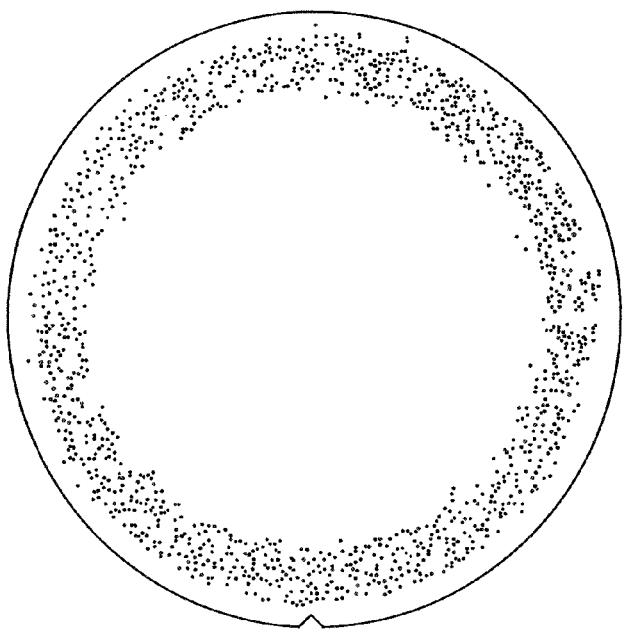
FIG. 5 is a distribution chart showing surface defects using the copper decoration method according to Comparative Example 2.
Figure 6:
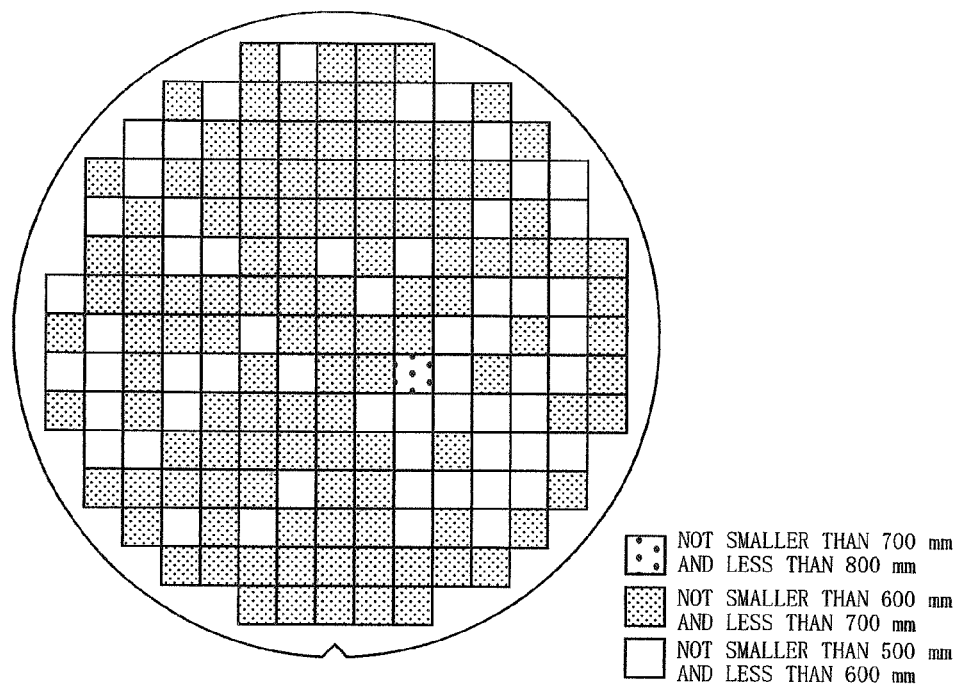
FIG. 6 is a distribution chart showing a minority carrier diffusion length in a wafer plane according to Example 3.
Figure 7:
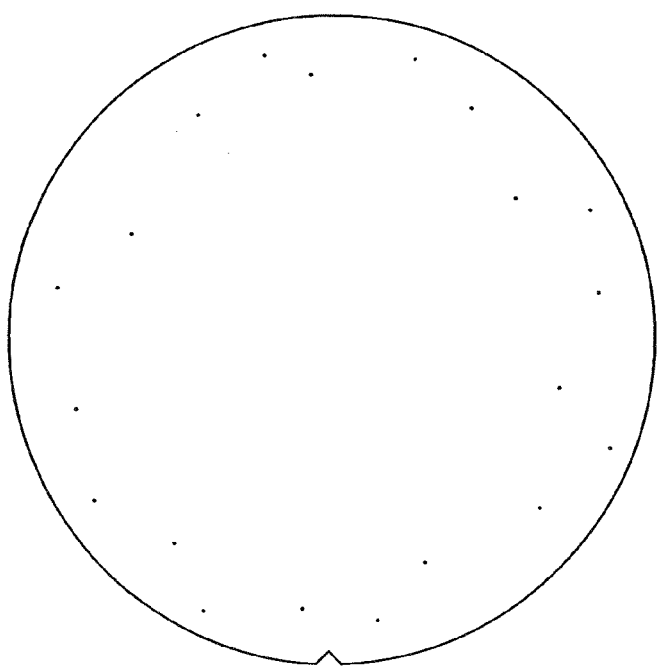
FIG. 7 is a distribution chart showing surface defects using the copper decoration method according to Comparative Example 3.

FIGS. 2, 4 and 6 show calculation results of Examples 1 to 3, and FIGS. 3, 5 and 7 show results of Comparative Examples 1 to 3.

As apparent from FIGS. 2 to 5, defects are concentrated in the vicinity of an outer periphery of the wafer in detection distributions obtained by the copper decoration method according to Comparative Example 1 and Comparative Example 2. On the other hand, in results of Example 1 and Example 2, regions having a short minority carrier diffusion length are concentrated in the vicinity of the outer periphery of the wafer and regions having a long minority carrier diffusion length are concentrated in the center of the wafer. It was revealed that the minority carrier diffusion length distribution of Example 1, the detection distribution of Comparative Example 1, the minority carrier diffusion length distribution of Example 2 and the detection distribution of Comparative Example 2 are well associated with each other.

Further, as apparent from FIGS. 6 and 7, the entire surface of the wafer is dotted with surface detects in a detection distribution obtained by the copper decoration method according to Comparative Example 3. On the other hand, in a result of Example 3, regions having a short minority carrier diffusion length do not exist, and the entire surface of the wafer is covered with regions having a long minority carrier diffusion length. It was found out that the minority carrier diffusion length distribution of Example 3 is well associated with the detection distribution of Comparative Example 3.

It was confirmed from this result that regions having a short carrier diffusion length are detected in the vicinity of the outer periphery of the wafer which is the evaluation target in Example 1 and Example 2, and this wafer is a wafer cut out from the ingot controlled and pulled up in such a manner that a V/G ratio includes a range of $(V/G)_1$ to a critical point $(V/G)_c$ and a range of the critical point $(V/G)_c$ to $(V/G)_2$ and is composed of these ranges alone, but the P-band region and the region [Vs] as well as the region [Pi] and the region [Pv] exist in the vicinity of the outer periphery of the wafer. On the other hand, regions having a short carrier diffusion length are not detected in the wafer which is the evaluation target in Example 3, and this backs up a fact that COP's or small COP's which cannot be detected by a particle counter do not exist on the entire wafer surface, thereby confirming that the wafer was manufactured under control at the time of a pull-up operation.

EXAMPLE 4

First, a p-type silicon single-crystal ingot having a body portion with a diameter of 300 mm was controlled and pulled up in such a manner that a region [I], a B-band region, a region [Pi], a region [Pv], a P-band region and a region [Vs] are included in an axial direction of the ingot and a V/G ratio includes both a range of $(V/G)_5$ to a critical point $(V/G)_c$ and a range of the critical point $(V/G)_c$ to $(V/G)_4$. This ingot was subjected to block cutting, external diameter grinding and slicing in an axial direction, i.e., a longitudinal direction to cut out a p-type silicon wafer having a diameter of 300 mm. A surface of this wafer was machine-polished to improve the parallelism, thereby an evaluation target wafer being provided.

Then, as a rapid heat treatment step, a measurement sample was put into a heat treatment furnace having an atmosphere which can nitride silicon therein by introducing a mixed gas containing an $NH_3$ gas and an Ar gas with a ratio of 20:80, a heat treatment was performed at a temperature elevating speed of 50° C./second from a room temperature to 1175° C., and the measurement sample was held at 1175° C. for 10 seconds. Thereafter, the measurement sample was cooled to the room temperature at a temperature lowering speed of 10° C./second. Subsequently, the measurement sample subjected to the rapid heat treatment was brought into contact with an HF solution to terminate silicon in a measurement sample surface layer with hydrogen.

Then, an SPV device (a model name: FAaST330 manufactured by SDI) was used to calculate a minority carrier diffusion length on a surface of the measurement sample. A measurement range of the diffusion length is 1 to 2.5-fold (approximately 1900 μm) of a thickness of the wafer. The minority carrier diffusion length on the surface of the measurement sample was calculated by dividing a region of the measurement sample surface into small regions having a size of 15×15 and classifying the respective small regions based on a range which is not smaller than 300 μm and less than 400 μm, a range which is not smaller than 400 μm and less than 500 μm, a range which is not smaller than 500 μm and less than 600 μm, a range which is not smaller than 600 μm and less than 700 μm and a range which is not smaller than 700 μm and less than 800 μm to which the minority carrier diffusion length belongs.

Comparative Example 4

Two measurement samples cut out from the same lot as that of the measurement sample used in Example 4 were prepared Surface defects on a measurement sample surface were detected by a copper decoration method like Comparative Example 1 except that one measurement sample was determined as a dummy sample and the other measurement sample was used as a measurement sample.

Comparative Example 5

A measurement sample cut out from the same lot as that of the measurement sample used in Example 4 was prepared, a life time was evaluated by a μ-PCD method (Microwave Detected Photoconductive Decay Method), and each defect distribution region was evaluated.

Comparative Test 2

Figure 8:
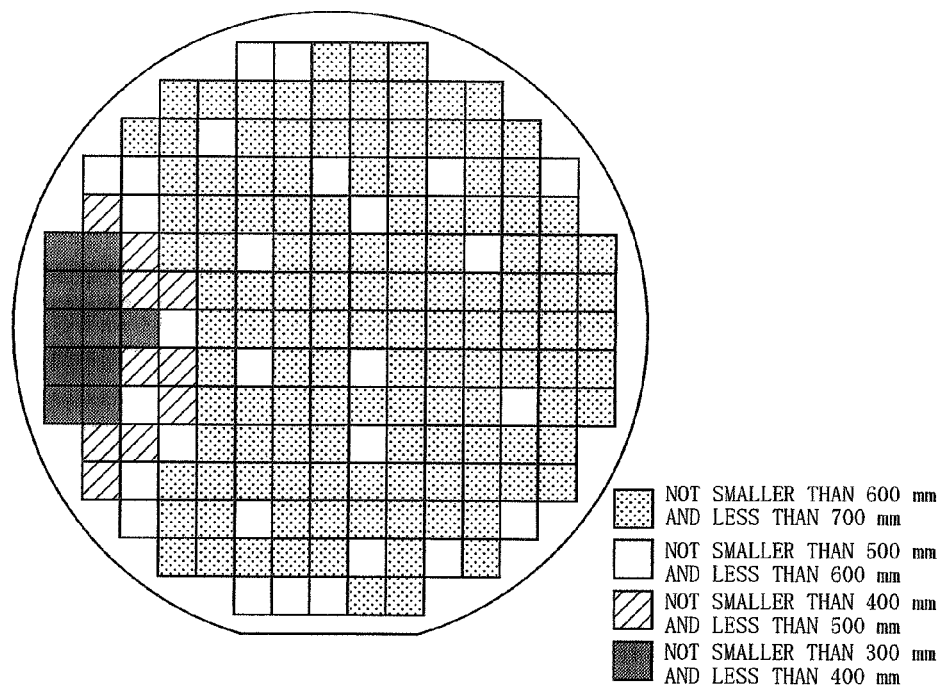
FIG. 8 is a distribution chart showing a minority carrier diffusion length in a wafer plane according to Example 4.
Figure 9:
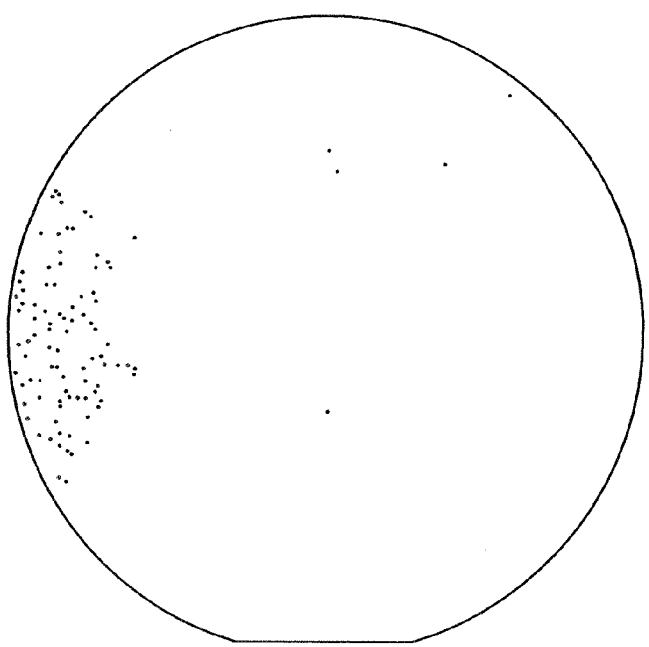
FIG. 9 is a distribution chart showing surface defects using the copper decoration method according to Comparative Example 4.
Figure 10:
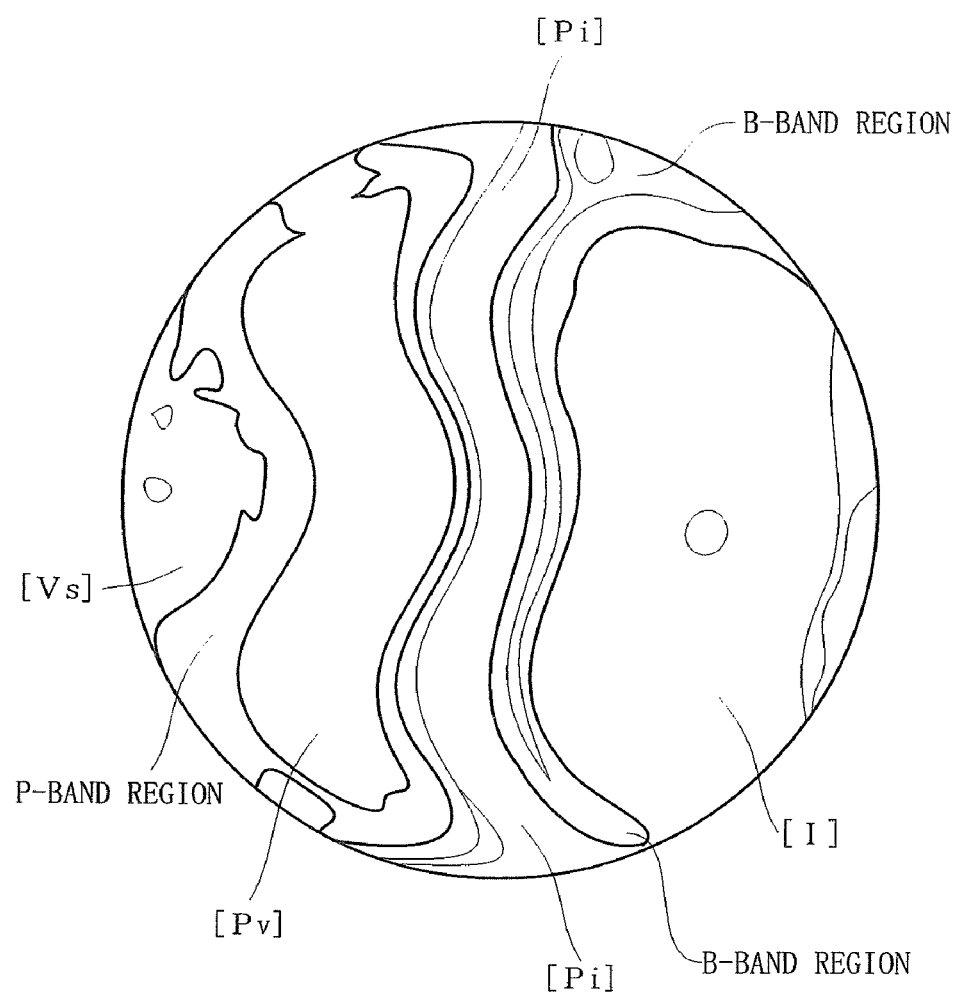
FIG. 10 is a distribution chart of a wafer plane using a μ-PCD method according to Comparative Example 5.

FIG. 8 shows a calculation result of Example 4, and FIGS. 9 and 10 show results of Comparative Examples 4 and 5, respectively.

As apparent from FIG. 10, in a detection distribution obtained by the μ-PCD method in Comparative Example 5, it was clearly shown that how a region [I], a B-band region, a region [Pi], a region [Pv], a P-band region and a region [Vs] are distributed in a wafer plane. As depicted in FIG. 9, in a detection distribution obtained by the copper decoration method in Comparative Example 4, defects are concentrated in the vicinity of an outer periphery of the wafer on a left-hand side, and thereby match with a position of the region [Vs] where COP's exist which is shown in FIG. 10. On the other hand, as shown in FIG. 8, in a result of Example 4, regions with a short minority carrier diffusion length are concentrated in the vicinity of the outer periphery of the wafer on the left-hand side whilst regions having a long minority carrier diffusion length are concentrated in regions other than those on the left-hand side, and it was revealed that a minority carrier diffusion length distribution of Example 4 and detection distributions of Comparative Examples 4 and 5 are well associated with each other. It was confirmed from this result that a region where small COP's which cannot be detected by a particle counter exist can be readily detected by the evaluation method according to the present invention. Since information such as a distribution with regard to crystal defects on a wafer can be accurately recognized by the evaluation method according to the present invention, it is possible to perform examination so as to suppress occurrence of crystal defects from the initial stage of manufacture of the wafer based on such information, thereby facilitating production of the silicon wafer consisting of a defect-free region. Furthermore, in a case where a wafer is a wafer which does not include a region [I], it is possible to confirm that an entire surface of the wafer is a defect-free region if a region where small COP's which cannot be detected by a particle counter exist is not detected, thus further facilitating manufacture of the silicon wafer consisting of a defect-free region.

What is claimed is:

1. A method for evaluating surface defects of a silicon wafer comprising:
   a rapid heat treatment step wherein a silicon wafer cut out from a silicon single-crystal ingot is subjected to a heat treatment in an atmosphere which includes at least one of an $NH_3$ gas, $N_2$ gas, $N_2O$ gas, an NO gas, or a mixed gas atmosphere containing these gases with an inert gas, and wherein the temperature is elevated at a speed of 10 to 150° C./second from a room temperature to temperatures between 1170° C. and less than the melting point of silicon, holding the silicon wafer at this processing temperature for 1 to 120 seconds, and then cooling the silicon wafer to the room temperature at a temperature lowering speed of 10 to 100° C./second; and a step of detecting a region on the wafer surface where small COP's exist at least by a particle counter using a surface photo voltage method to calculate a minority carrier diffusion length on the wafer surface,
   wherein a detected amount of the small COP's which are not smaller than 0.065 μm, when measured by an SP-1 particle counter, is substantially zero.

2. The method according to claim 1, further comprising a step of performing HF processing with respect to the wafer surface before the step of detecting a region on the wafer surface where small COP's exist when the silicon wafer is a p-type semiconductor.

3. The method according to claim 1, wherein the wafer is a wafer consisting of a perfect region [P], a P-band region and a region [Vs], where [I] is a region in which interstitial silicon point defect agglomerates exist, [V] is a region where vacancy point defect agglomerates exist, [P] is the perfect region where the interstitial silicon point defect agglomerates and the vacancy point defect agglomerates do not exist, the P-band region is a region which exists at a boundary of the region [V] on a side adjacent to the region [P] and in which an OISF nucleus is formed, and the region [Vs] is a region which exists at a boundary of the region [V] on a side adjacent to the P-band region and has small COP's, wherein a detected amount of the small COP's in the silicon single-crystal ingot which are not smaller than 0.065 μm, when measured by an SP-1 particle counter, is substantially zero.

4. The method according to claim 3, wherein the wafer is a wafer consisting of a mixed region of a region [Pv] and a region [Pi], the P-band region and the region [Vs], where [Pi] is a region which is adjacent to the region [I], belongs to the perfect region [P] and has an interstitial silicon concentration less than a minimum interstitial silicon concentration which allows formation of interstitial-type large dislocation, and [Pv] is a region which is adjacent to the region [V], belongs to the perfect region [P] and has a vacancy concentration which is not greater than a vacancy concentration which allows formation of COP's or FPD's.

5. The method according to claim 1, wherein, assuming that [I] is a region in which interstitial silicon is dominant and which has defects of interstitial silicon agglomerates, and wherein the rapid heat treatment is applied to a wafer which does not include the region [I], and a surface photo voltage method is used to calculate a minority carrier diffusion length on a surface of the wafer cooled to a room temperature at a temperature lowering speed of 10 to 100° C./second after holding the wafer at the processing temperature for 1 to 120 seconds, and wherein the wafer before the heat treatment is evaluated based on whether the minority carrier diffusion length on the entire surface of the wafer falls within the range of 500 to 800 μm.

\* \* \* \* \*